United States Patent
Chen et al.

(10) Patent No.: US 7,306,746 B2
(45) Date of Patent: Dec. 11, 2007

(54) CRITICAL DIMENSION CONTROL IN A SEMICONDUCTOR FABRICATION PROCESS

(75) Inventors: Fang-Cheng Chen, Hsin-chu (TW); Li Te Hsu, Tainan Shien (TW); I Cheng Tseng, Yongkang (TW); Hsu Chiung Wen, Taipei (TW); Tsung Chuan Chen, Tainan (TW); Pin Chia Su, Shanhua Township, Tainan County (TW)

(73) Assignee: Taiwan Semiconductor Manufacturing Co. Ltd., Hsin-Chu, ROC (TW)

( * ) Notice: Subject to any disclaimer, the term of this patent is extended or adjusted under 35 U.S.C. 154(b) by 261 days.

(21) Appl. No.: 10/768,455

(22) Filed: Jan. 30, 2004

(65) Prior Publication Data
US 2005/0167397 A1 Aug. 4, 2005

(51) Int. Cl.
*B44C 1/22* (2006.01)
(52) U.S. Cl. .............................. 216/59; 216/60; 216/66; 216/72
(58) Field of Classification Search ................ 216/59, 216/60, 66, 72
See application file for complete search history.

(56) References Cited

U.S. PATENT DOCUMENTS

| 6,350,390 | B1 | 2/2002 | Liu et al. | |
|---|---|---|---|---|
| 6,369,891 | B1 | 4/2002 | Kane et al. | |
| 6,388,253 | B1 | 5/2002 | Su | |
| 6,486,492 | B1 | 11/2002 | Su | |
| 2004/0198065 | A1* | 10/2004 | Lee et al. | 438/725 |
| 2004/0203177 | A1* | 10/2004 | Davis et al. | 438/14 |
| 2004/0253812 | A1* | 12/2004 | Friedmann et al. | 438/636 |
| 2005/0085090 | A1* | 4/2005 | Mui et al. | 438/714 |

OTHER PUBLICATIONS

Guenther Ruhl et al., "Optimizing The Chromium Dry Etch Process", at http://www.reed-electronics.com/semiconductor/index.asp?layout=articlePrint&articleID=C... Aug. 5, 2003.
W. Jarrett Campbell, Ph.D., "Run-To-Run Control Of Photolithography Processes", Summer 2000 Yield Management Solutions, pp. 65-68.

* cited by examiner

*Primary Examiner*—Binh X. Tran
(74) *Attorney, Agent, or Firm*—Duane Morris LLP

(57) ABSTRACT

A method for controlling a critical dimension in an etched structure comprises the steps of: forming a hard mask above a substrate, measuring a critical dimension of the hard mask, and using the measured hard mask critical dimension to control a critical dimension trim operation performed on a circuit trace above the substrate.

14 Claims, 3 Drawing Sheets

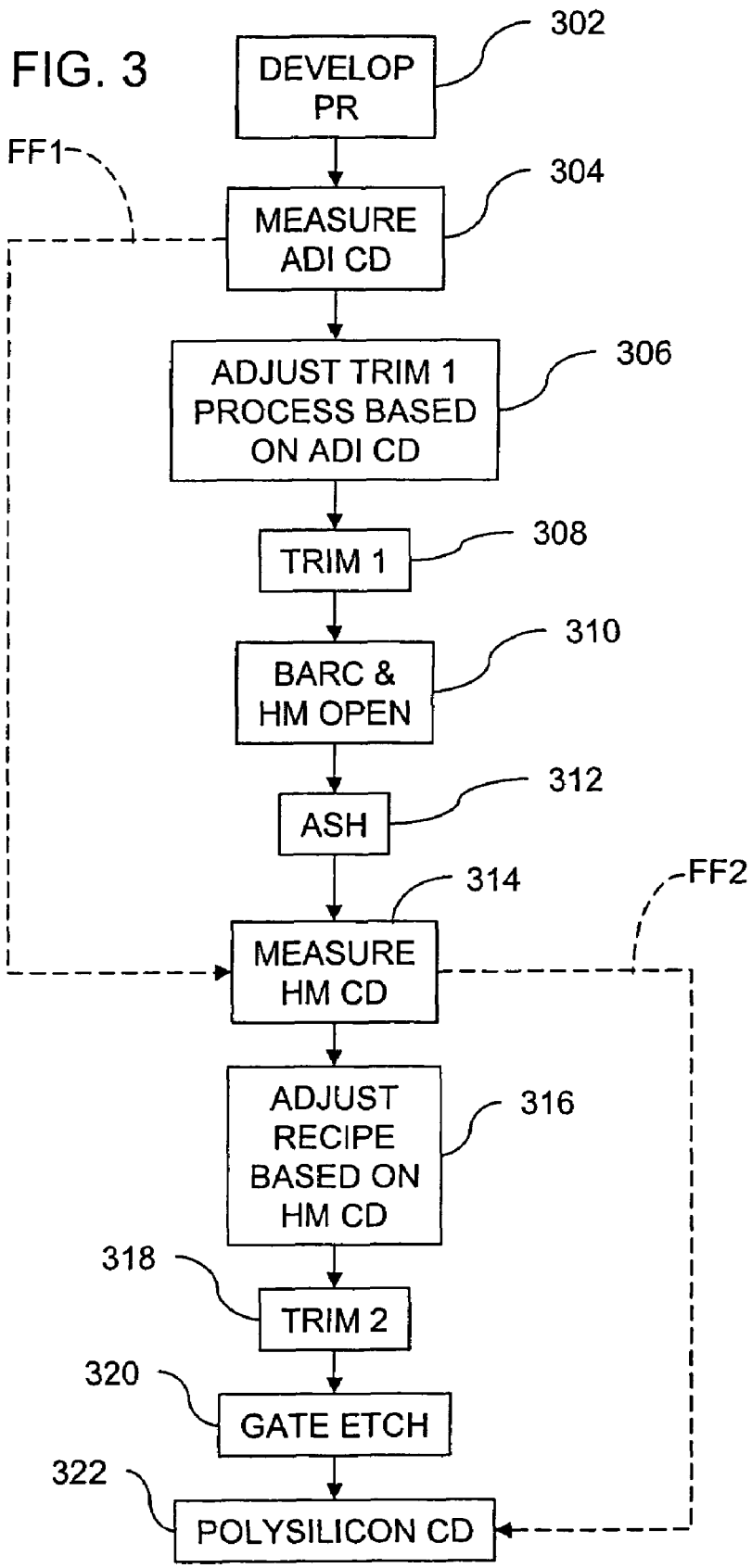

CRITICAL DIMENSION CONTROL IN A SEMICONDUCTOR FABRICATION PROCESS

FIELD OF THE INVENTION

The present invention relates to semiconductor device fabrication, and more specifically to methods for controlling critical dimensions.

BACKGROUND

Engineering Advanced Process control (APC) uses measurements of important process variables to incorporate into a feedback loop for control. The process input parameters are adjusted based on the measurements of the process output products. The process parameter set points may be varied to implement batch control for wafers.

Critical dimension (CD) is a key process parameter in photolithography, and a great deal of effort has been directed towards CD control. However, CD control is more complex than merely using feedback between the stepper and the CD metrology tool, because there is an etch bias between the after develop inspection (ADI) dimension and the after etch inspection (AEI) dimension. The etch bias may result from photoresist shrinkage or deviation from the scanning electron microscope (SEM) measurement of the photoresist CD. The etch bias is a significant problem, especially for 90 nanometer technology and more advanced technologies. In conventional systems, ex-situ CD SEM data based on the ADI measurement of the CD are fed forward to change the etch recipe (i.e., the etching parameters, such as etching time). The goal is to adjust the etch recipe to meet the target AEI CD. U.S. Pat. No. 6,350,390 is incorporated by reference herein in its entirety, as though set forth fully herein. U.S. Pat. No. 6,350,390 describes a method for correlating the ADI and AEI critical dimensions.

Unfortunately, the ADI CD and AEI CD do not have a very strong correlation. The ADI CD measurement (of the photoresist) is unstable and unreliable, due to shrinkage of photoresist, beginning with 130 nm technology, and especially when 90 nm technology and more advanced technologies are used. Frequently, feed forward adjustments to the etch recipe based on the ADI CD do not produce the target AEI CD with the desired accuracy. The measured CD value depends strongly on the shape of the sidewall of the measured structures. For example, predictions of the AEI CD based on the ADI CD are likely to be inaccurate if the shapes of the sidewalls of the measured structures are different from the shapes of the sidewalls of the standard samples used to calibrate the relationship between the AEI CD and the ADI CD. Precise control using ADI feedforward information requires photoresist profile information and a clear understanding of the relationship between the feature profile, CD and etching behavior. This is very difficult to obtain.

SUMMARY OF THE INVENTION

A method for controlling a critical dimension in an etched structure, comprising the steps of: forming a hard mask above a substrate, measuring a critical dimension of the hard mask, and using the measured hard mask critical dimension to control a critical dimension trim operation performed on a circuit trace above the substrate.

BRIEF DESCRIPTION OF THE DRAWINGS

FIG. 3 is a flow chart of a second exemplary method according to the invention.

DETAILED DESCRIPTION

Figure 1:
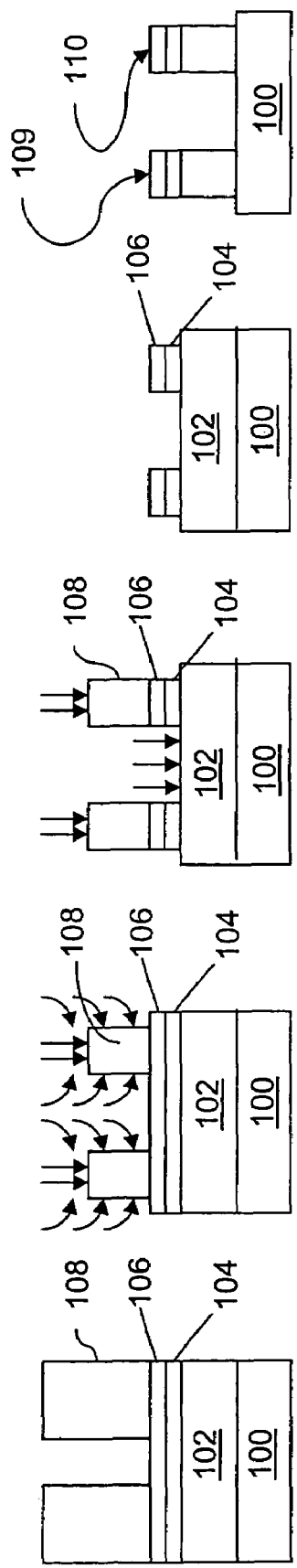
FIGS. 1A-1E show a semiconductor fabrication process in which embodiments of the invention may be practiced.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

The inventors have found that the correlation between CD measurements of the hard mask and the final AEI CD are much higher than the correlation between the ADI CD and the AEI CD. The hard mask CD can be measured in situ during processing. With a hard mask etch process and in-situ CD metrology, the feed forward control can use the hard mask AEI CD as the input CD value and control the following etch process to precisely control the final AEI CD. This provides more precise CD control than is possible if the feed forward control is solely based on the ADI CD. The hard mask CD does not shrink and is more stable than the ADI measurement. In some embodiments, an optional additional rough adjustment to the initial trim operation is made based on the ADI CD, followed by the above-mentioned use of the hard mask CD feed forward to control the second trim operation and gate etch recipe.

FIGS. 1A to 1E show the processing steps of a process in which the above described hard mask CD feed forward technique can be implemented.

FIG. 1A shows a configuration including a substrate 100 having an insulating layer 102, polycrystalline silicon layer 104, blanket anti-reflective coating (BARC) layer 106, and photoresist layer 108.

And exemplary method for providing the structure of FIG. 1A includes providing eight or twelve inch diameter semiconductor substrates 100 of silicon or other suitable semiconductor. The insulating layer 102 formed on the substrate 100 may be, for example, a silicon oxide dielectric layer. One or more blanket doped polysilicon layers 104 are formed on the oxide layer 102, for example, having a thickness of about 2,000 angstroms. One or more blanket organic polymer anti-reflective coating (ARC) layers 106 may be formed of an organic polymer antireflective coating material, such as DUV 42-8 anti-reflective coating (ARC) material available from Brewer Science, Inc., Rolla, Mo., Brewer Science. The organic polymer anti-reflective coating (ARC) material may be coated and thermally cured at a temperature of about 110 degrees centigrade to provide ARC layer(s) of thickness about 1500 angstroms. One or more patterned photoresist layers 108 may then be of any suitable photoresist. For example, the photoresist may be Sepv 432 photoresist material available from Shinetsu formed to a thickness of about 6500 angstroms and may include patterns of measured linewidth about 0.25 microns by about 0.29 microns. Although exemplary materials are described, other materials and thicknesses may be used.

FIGS. 1B and 1C show an exemplary process for photoresist trimming (FIG. 1B) and hard mask opening (FIG. 1C). A two-step etch process may be used, including a wet etch process as shown in FIG. 1B, and one or more dry etch process(es), as shown in FIG. 1C.

In a first exemplary plasma (dry) etch step, an etchant gas composition comprising hydrogen bromide, oxygen and nitrogen may be used. This exemplary method may include: (1) a reactor chamber pressure of about 6 mtorr; (2) a top source radio frequency power of about 275 watts at a source radio frequency of 13.56 MHZ and a bias power of about 75 watts; (3) a semiconductor substrate temperature of about 65 degrees centigrade; (4) a hydrogen bromide flow rate of about 50 standard cubic centimeters per minute (sccm); (5) a nominal oxygen flow rate of about 10 standard cubic centimeters per minute (sccm) with multiple offset adjustments; and (6) a nitrogen flow rate of about 6 standard cubic centimeters per minute (sccm). A second exemplary dry etch step may use chlorine and hydrogen bromide, and may include: (1) a reactor chamber pressure of about 20 mtorr; (2) a top source radio frequency power of about 250 watts at a source top radio frequency of 13.56 MHZ and a bias power of about 80 watts; (3) a semiconductor substrate temperature of about 65 degrees centigrade; (4) a chlorine flow rate of about 80 standard cubic centimeters per minute (sccm); and (5) a hydrogen bromide flow rate of about 120 standard cubic centimeters per minute (sccm). This set of dry etch steps is only exemplary, and any other etching process may be used.

Following the hard mask opening, the photoresist 108 and BARC 106 are removed by ashing, as shown in FIG. 1D.

Finally, in the gate etch step, the patterned polysilicon layer 104 and the oxide layer 102 can be etched in-situ, as shown in FIG. 1E, to form an NMOS gate structure 109 and a PMOS gate structure 110. For example a plasma etch step may be used. An etchant gas composition comprising hydrogen bromide, helium and oxygen may be used. The step may include: (1) a reactor chamber pressure of about 60 mtorr; (2) a top source radio frequency power of about 250 watts at a top radio frequency of 13.56 MHZ and a bias power of about 80 watts; (3) a semiconductor substrate temperature of about 65 degrees centigrade; (4) a hydrogen bromide flow rate of about 200 standard cubic centimeters per minute (sccm); (5) a helium:oxygen (80:20, vol:vol) flow rate of about 3.3 standard cubic centimeters per minute (sccm); and (6) a helium flow rate of about 100 standard cubic centimeters per minute (sccm). Other etching techniques may be used.

Figure 2:
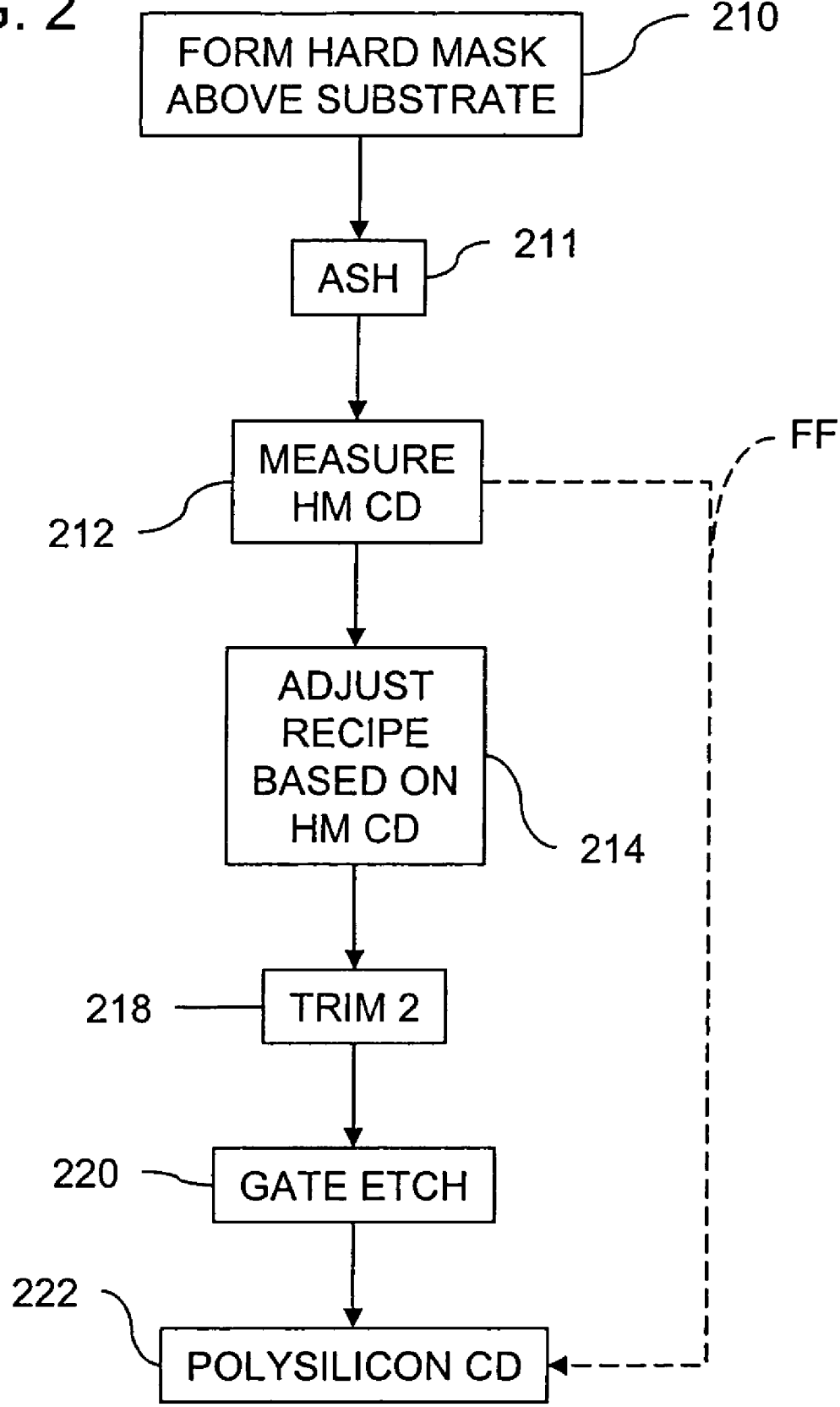
FIG. 2 is a flow chart of a first exemplary method according to the invention.

FIG. 2 shows a first exemplary method for feeding forward hard mask CD data to control the above described trim operation. In this example, a substrate having the oxide 102, polycrystalline silicon 104, BARC 106 and patterned photoresist 108 is first provided.

At step 210, a hard mask 106 is formed above a substrate.

At step 211, the photoresist 108 above the hard mask is removed by ashing.

At step 212, a critical dimension of the hard mask is measured in situ in the processing tool. For example, one can use a spectroscopic ellipsometer based profile metrology tool. An exemplary tool is the F100-SCD by KLA-Tencor of San Jose, Calif. (for measuring the so-called optical CD). Alternatively, the functionally similar technology of reflectometry can be used. Those skilled in the art can readily determine other alternative methods and tools for measuring the hard mask CD.

At step 214, the measured hard mask critical dimension is used to adjust the trim recipe. For example, the trim recipe may be adjusted by varying the etch time of the trim operation.

At step 218, the trim operation is performed.

At step 220, the gate polycrystalline silicon etch process is performed.

At step 222, the final gate CD is reached. As shown by the dashed line FF, the measured hard mask CD is fed forward to achieve the desired AEI CD.

Using the above technique, lithography effects are eliminated. A robust trimming curve can be used, so that it is possible to adjust the trim and gate etch operations precisely to achieve the desired CD.

In one example, the ADI CD of 105 nanometers was measured. Following the photoresist trim and hard mask open (step 210), the hard mask CD was 91 nanometers. Following the trim operation (step 218), the desired AEI CD of 85 nanometers was achieved. Table 1 lists experimental data for three wafers processed to demonstrate the technique.

TABLE 1

| Wafer No. | Test | Etch Bias (In Situ CD) | In Situ CD Hard Mask Thickness |
|---|---|---|---|
| 1 | BARC + HM + TRIM1 + ASH | 7.2 nm | 75 nm |
| 2 | BARC + HM + TRIM1 + ASH + TRIM2 + ASH2 | 18.1 nm | 64 nm |
| 3 | BARC + HM + TRIM1 + ASH + TRIM2 + Gate Etch | 21.2 nm | 16 nm |

Wafer 1 is a partially processed wafer with measurement taken following the photoresist ash step 211. Wafer 2 is also a partially processed wafer. Wafer 3 is fully processed through the gate etch step. The fully processed wafer CD bias is around −20 nm. The differences between wafer 1 and 2 are:

(1) Trim 2: this trim 2 changes the hard mask CD.

(2) Ash 2: this step does not change the real CD but can remove sidewall polymer and can affect a CD SEM measurement.

Wafer 1 was processed to demonstrate that the hard mask CD could be measured by an in-situ approach. Wafer 2 was processed to demonstrate that trim technology can be used to reduce the hard mask CD. Wafer 3 was processed to demonstrate that the final gate etch CD is very close to target −20 nm.

It was demonstrated that the technique of FIG. 2 can detect the CD bias difference between wafer 1 and wafer 2. In this example, the in situ hard mask CD technique measured 10.9 (18.1-7.2) nm CD bias change during trim 2 step.

For this particular system, the correlation between trim time and CD change is given by the equation CD change=0.45*(trim 2 time)

In an example of applying the results, one can set the target of the trim 1 CD bias to be 7.2 nm. If a new wafer is processed, and the in situ hard mask CD measurement (after trim 1) indicates a CD bias of 5.2 nm, the trim 2 step time can be prolonged by 4.4 seconds using the feed forward of the trim 1 CD bias to compensate for the 2 nm difference. Although an equation is provided above for an exemplary tool, one of ordinary skill recognizes that the relationship between a change to trim time 2 and the resulting change in CD is determined experimentally for each individual tool and/or process. For example, another exemplary process showed that the change in CD Bias of about 1.5 nm for each 1 second change in the trim 2 step.

FIG. 3 is a flow chart showing a more detailed example including an optional rough adjustment to the first trim process (trim 1).

At step 302, the photoresist 108 is developed above the substrate. Any positive or negative photoresist may be used.

At step 304, the ADI CD is measured. As shown by the dashed line FF1, the ADI CD may be used to perform the first (rough) adjustment of a two-stage adjustment process. The ADI CD is fed forward, to provide a degree of control over the processing steps up to the opening of the hard mask 106.

As explained above, the correlation between the ADI CD and the final AEI CD is not as strong as the correlation between the hard mask CD and the AEI CD. The precision of ADI CD feed forward is limited by the shape of photo resist. In order to get the most precise control possible from ADI CD feed forward, one must obtain the photo-resist profile information and understand the relationship between profile, CD and etch behavior. In practice, this may be difficult. However, by adding the rough adjustment of step 304, the size of the second trim operation can still be reduced, so that finer control can be used in the second trim operation, discussed below.

At step 306, the photoresist trim operation (of FIG. 1B) is adjusted based on the ADI CD. For example, an adjusted trim time can be selected based on the ADI CD.

At step 308, the adjusted trim operation is performed, using the parameters selected at step 306.

At step 310, the blanket anti-reflective coating (BARC) and hard mask are opened, as shown in FIG. 1C.

At step 312, the remaining photoresist is removed by ashing, to form the configuration as shown in FIG. 1D.

At step 314, the hard mask CD is measured in situ.

At step 316, the measured hard mask critical dimension is used to adjust the trim recipe. For example, the trim recipe may be adjusted by varying the etch time of the trim operation.

At step 318, the second trim operation is performed.

At step 320, the gate polycrystalline silicon etch process is performed.

At step 322, the final gate CD is reached, (the configuration shown in FIG. 1E). As shown by the dashed line FF2, the measured hard mask CD is fed forward to achieve the desired AEI CD.

A semiconductor device formed by the above-described methods has improved dimensional control. The techniques described above may be applied to improve process control with all types of photoresists, particularly those that exhibit shrinkage.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for controlling a critical dimension in an etched structure, comprising the steps of:
   (a) forming only a single hard mask on at least one material layer formed over a substrate;
   (b) directly measuring a critical dimension of the hard mask when the hard mask is uncovered;
   (c) using the measured hard mask measured critical dimension to adjust an etch time of a critical dimension trim operation performed on the hard mask layer to produce a trimmed hard mask layer with the at least one material layer still intact; and
   (d) after the critical dimension trim operation, carrying out an etching operation that etches the at least one material layer by using the trimmed hard mask layer as an etch mask.

2. The method of claim 1, further comprising using the measured hard mask critical dimension to control a gate etching operation performed on the substrate.

3. The method of claim 1, further comprising:
   performing an after develop inspection (ADI) of a critical dimension before step (a);
   performing a first critical dimension trim operation on the hard mask before step (b); and
   feeding forward a result of the ADI to control the first critical dimension trim operation.

4. The method of claim 1, wherein the critical dimension of the hard mask is measured in situ in a processing tool.

5. The method of claim 4, wherein a first critical dimension trim operation is performed before step (b).

6. A method for controlling a critical dimension in an etched structure, comprising the steps of:
   (a) developing a photoresist above at least one layer above a substrate;
   (b) performing a first critical dimension trim operation on the photoresist;
   (c) using the photoresist to open a hard mask above the substrate;
   (d) removing the photoresist;
   (e) directly measuring a critical dimension of the hard mask when the hard mask is uncovered, in situ in a processing tool;
   (f) determining an etch time of the trim operation on the hard mask as a function of the measured hard mask's measured critical dimension;
   (g) carrying out the trim operation to reduce the critical dimension of the hard mask while leaving the at least one layer unetched; and
   (h) after the trim operation, carrying out an etching operation that etches the at least one layer by using the trimmed hard mask layer as an etch mask.

7. The method of claim 6 further comprising using the measured hard mask critical dimension to control a gate etching operation performed on the substrate.

8. The method of claim 6, wherein step (b) is performed before step (e).

9. The method of claim 6, further comprising:
   performing an after develop inspection (ADI) of a critical dimension before step (b);
   performing step (b) before step (e); and
   feeding forward a result of the ADI to control the first critical dimension trim operation.

10. The method of claim 6, wherein the at least one layer comprises an oxide layer.

11. A method for controlling a critical dimension in an etched structure, comprising the steps of:
   (a) developing a photoresist formed on a single hard mask disposed above a substrate;
   (b) performing an after develop inspection (ADI) of a critical dimension;
   (c) performing a first critical dimension trim operation on the photoresist;
   (d) feeding forward a result of the ADI to control the first critical dimension trim operation;

(e) etching at least one layer above the substrate using the photoresist to open the hard mask above the substrate;

(f) removing the photoresist;

(g) directly measuring a critical dimension of the hard mask in situ in a processing tool, when the hard mask is uncovered;

(h) performing a second critical dimension trim operation on the hard mask without etching the at least one layer;

(i) determining an etch time of the trim operation on the hard mask as a function of the measured hard mask's measured critical dimension; and (j) after the performing a second critical dimension trim operation, etching the at least one layer by using the trimmed hard mask layer as an etch mask.

12. The method of claim 11 further comprising using the measured hard mask critical dimension to control a gate etching operation performed on the substrate.

13. The method of claim 11, wherein step (c) is performed before step (g).

14. The method of claim 11 wherein the at least one material layer comprises an oxide layer.

* * * * *